United States Patent
Hur et al.

(10) Patent No.: US 7,310,283 B2
(45) Date of Patent: Dec. 18, 2007

(54) APPARATUS AND METHOD FOR CONTROLLING CLOCK SIGNAL IN SEMICONDUCTOR MEMORY DEVICE

(75) Inventors: Hwang Hur, Ichon-shi (KR); Jun-Gi Choi, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 164 days.

(21) Appl. No.: 11/188,715

(22) Filed: Jul. 26, 2005

(65) Prior Publication Data
US 2006/0193195 A1    Aug. 31, 2006

(30) Foreign Application Priority Data
Feb. 28, 2005    (KR) .................... 10-2005-0016758

(51) Int. Cl.
*G11C 8/00*    (2006.01)

(52) U.S. Cl. .................... 365/233; 365/194; 360/51; 326/28; 714/814

(58) Field of Classification Search ............. 365/233, 365/194; 307/409; 326/28; 360/51; 370/518; 714/814
See application file for complete search history.

(56) References Cited

U.S. PATENT DOCUMENTS

| | | | | |
|---|---|---|---|---|
| 5,708,624 A * | 1/1998 | Leung | .................... | 365/233 |
| 5,973,989 A * | 10/1999 | Pawlowski | .................... | 365/233 |
| 5,999,483 A * | 12/1999 | Itou | .................... | 365/233 |
| 6,857,066 B2 * | 2/2005 | Bigbee et al. | .................... | 713/1 |
| 2005/0246586 A1* | 11/2005 | Chang | .................... | 714/36 |
| 2006/0129867 A1* | 6/2006 | Brodsky | .................... | 713/500 |

* cited by examiner

*Primary Examiner*—Richard T. Elms
*Assistant Examiner*—Eric Wendler
(74) *Attorney, Agent, or Firm*—McDermott Will & Emery LLP

(57) ABSTRACT

An operation clock controller for preventing a semiconductor memory device from operating when an operation frequency of an external clock is higher than a predetermined frequency. The operation clock controller includes a clock buffer for buffering an external clock to output an internal clock; a unit delaying set for sequentially delaying the internal clock to output a plurality of delayed clocks; a phase detecting block for detecting logic levels of the delayed clocks at a rising edge of the internal clock to output phase detecting signals; a sampling pulse generator for outputting a sampling signal generated at a predetermined point of the internal clock; a latching block for outputting a phase detection latch signal by sampling and latching the phase detection signal at a point of the sampling signal being inputted; and a frequency detection block for outputting the frequency detection signal by logically combining the phase detection latch signal.

15 Claims, 9 Drawing Sheets

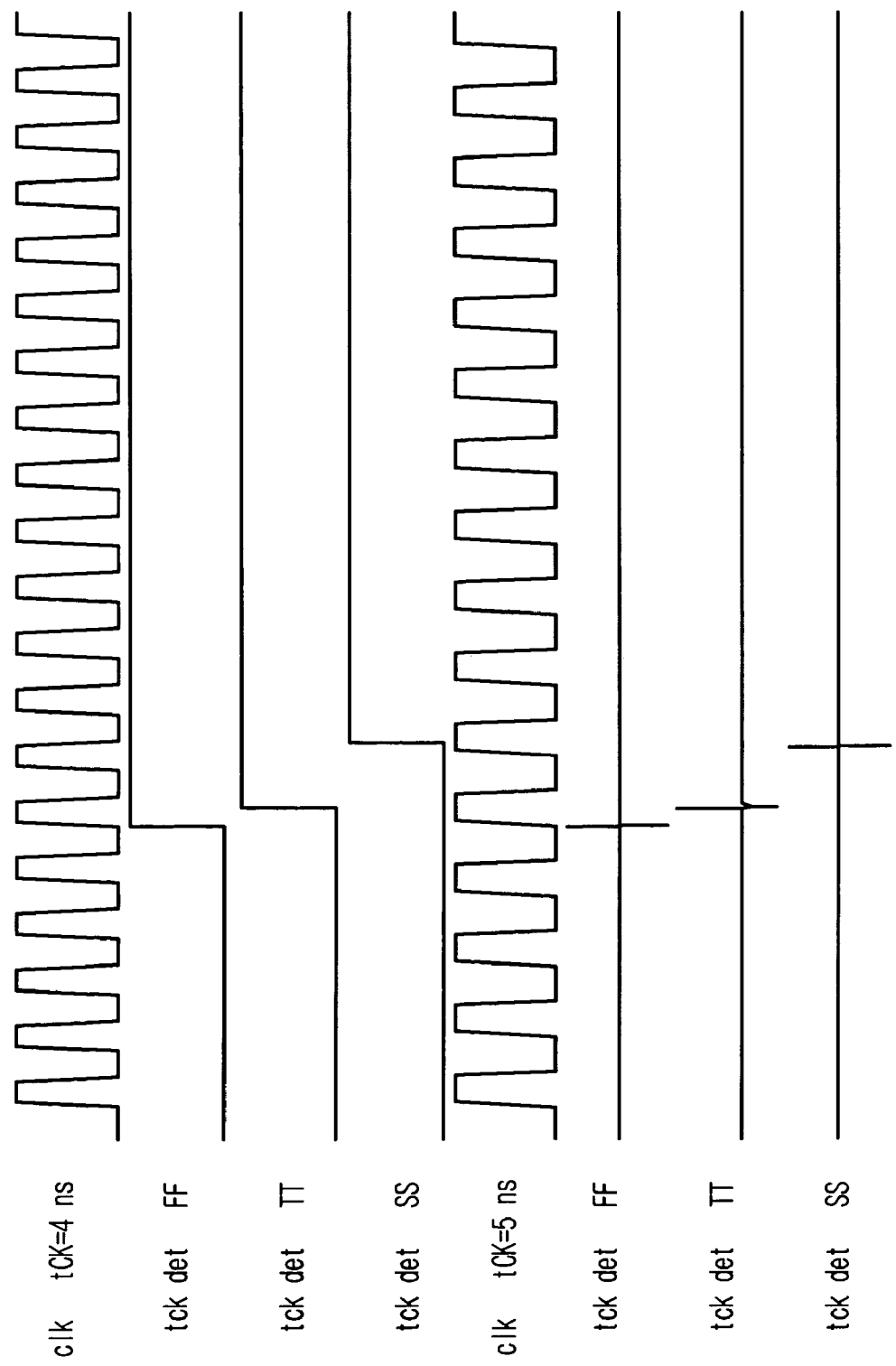

APPARATUS AND METHOD FOR CONTROLLING CLOCK SIGNAL IN SEMICONDUCTOR MEMORY DEVICE

FIELD OF INVENTION

The present invention relates to a semiconductor memory device; and, more particularly, to an operation clock controller for controlling an operation frequency of an external clock so that the operation frequency do not exceed a predetermined frequency.

DESCRIPTION OF PRIOR ART

As a data processing speed of a DRAM is increased, the performance of the DRAM is also increased. Accordingly, much effort has been spent on improving the data processing speed of the DRAM. However, even if a DRAM having a high data processing speed is produced, it is occasionally occurs that the DRAM is sold as a down-graded product, i.e., a DRAM having lower operation speed than the high data processing speed if a market of the DRAM is not sufficiently formed. For example, although a DDR500 can be produced in commercial quantity, the DDR500 has to be down-grade and be sold instead of a DDR400 which possesses a dominant model in the market if the demand for the DDR500 is not sufficiently established. However, though it is down-graded for sale, the DDR500 can be still operated as DDR500 having higher data processing speed. Therefore, there is a possibility that a malicious manufacturer purchases the DDR500 cheaply and produces a module using the rapid data processing character by over-clocking the DRAM. Thus, for protecting DRAM venders, it is required to make a DRAM once down-graded not operate under an over clock condition. In order to prevent the abovementioned over clocking of the DRAM, it is required to detect a period of a clock inputted to the DRAM.

SUMMARY OF INVENTION

It is, therefore, an object of the present invention to provide an operation clock controller that prevents a semiconductor memory device from operating under an over clock condition that an operation frequency is higher than a predetermined frequency.

It is another object of the present invention to provide an operation clock controlling method that prevents a semiconductor memory device from operating under an over clock condition that an operation frequency is higher than a predetermined frequency.

In accordance with an aspect of the present invention, there is provided an operation clock controller including a clock buffer for buffering an external clock to thereby output an internal clock; a unit delaying set for sequentially delaying the internal clock to thereby output a plurality of delayed clocks; a phase detection block for detecting logic levels of the delayed clocks at a rising edge of the internal clock to thereby output corresponding phase detecting signals; a sampling pulse generator for outputting a sampling signal generated at a predetermined point of the internal clock; a latching block for outputting a phase detection latch signal by sampling and latching the phase detection signal at a point of the sampling signal being inputted; and a frequency detection block for outputting the frequency detection signal by logically combining the phase detection latch signal.

In accordance with another of the present invention, there is provided an operation clock controlling method including the steps of: outputting an internal clock by buffering an external clock; and outputting a plurality of delayed clock by sequentially delaying the internal clock; detecting logic levels of the delayed clocks at a rising edge of the internal clock to thereby output corresponding phase detecting signals; outputting a sampling signal generated at a predetermined point of the internal clock; outputting a phase detection latch signal by sampling and latching the phase detection signal at a point of the sampling signal being inputted; outputting an enable signal in response to an external command; and outputting the frequency detection signal by logically combining the phase detection latch signal.

BRIEF DESCRIPTION OF THE DRAWINGS

The above and other objects and features of the present invention will become apparent from the following description of preferred embodiments taken in conjunction with the accompanying drawings, in which:

FIG. 10 is a timing diagram showing an operation of the present invention when the operation frequency is deviated by 5%.

DETAILED DESCRIPTION OF INVENTION

Hereinafter, an operation clock controller in accordance with the present invention will be described in detail referring to the accompanying drawings.

Figure 1:
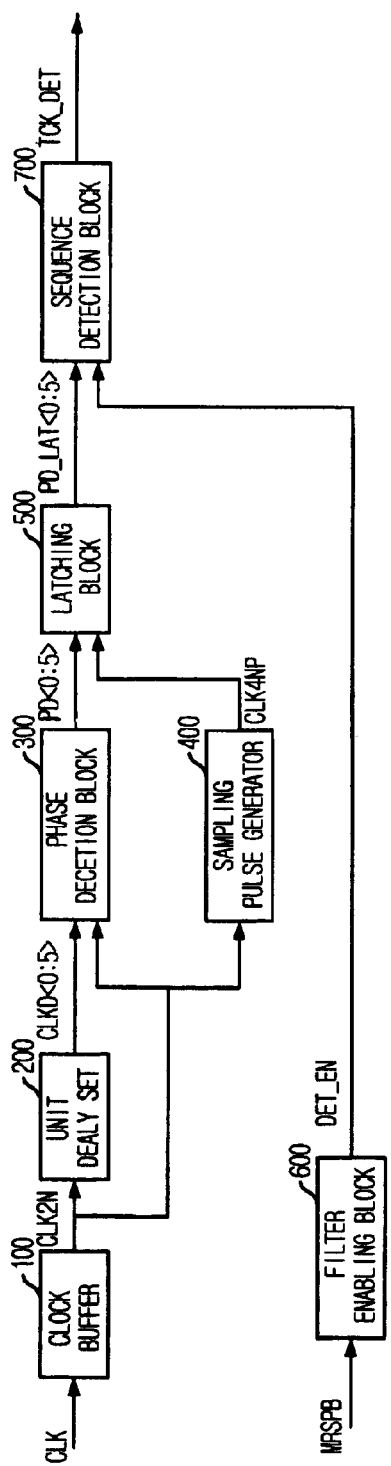
FIG. 1 is a block diagram describing an operation clock controller in accordance with a preferred embodiment of the present invention.

FIG. 1 is a block diagram describing an operation clock controller in accordance with a preferred embodiment of the present invention.

As shown, the operation clock controller includes a clock buffer 100, a unit delay set 200, a phase detection block 300, a sampling pulse generator 400, a latching block 500, a filter enabling block 600, and a sequence detection block 700.

The clock buffer 100 buffers an external clock CLK to thereby output an internal clock CLK2N. The unit delay set 200, to which the first internal clock CLK2N is inputted, is provided with a plurality of unit delays and outputs a plurality of delayed clock CLKD<0:5> sequentially. The phase detection block 300 outputs a plurality of phase detection signal PD<0:5> corresponding to the delayed clocks CLKD<0:5>. The sampling pulse generator 400 outputs a sampling signal CLK4NP at a falling edge or a rising edge of the internal clock CLK2N. For example, the sampling signal CLK4NP can be formed at a second falling edge of the internal clock CLK2N. The latching block 500 samples and lathes the phase detection signal PD<0:5> to output a phase detection latch signal PD_LAT<0:5> at a time when the sampling signal CLK4NP is supplied. The filter enabling block 600 outputs an enable signal DET_EN for enabling the operation clock controller of the present invention in response to an external command. The sequence detection block 700 detects a sequence of the phase detection latch signal PD_LAT<0:5> to thereby output a frequency detection signal TCK_DET.

Figure 2:
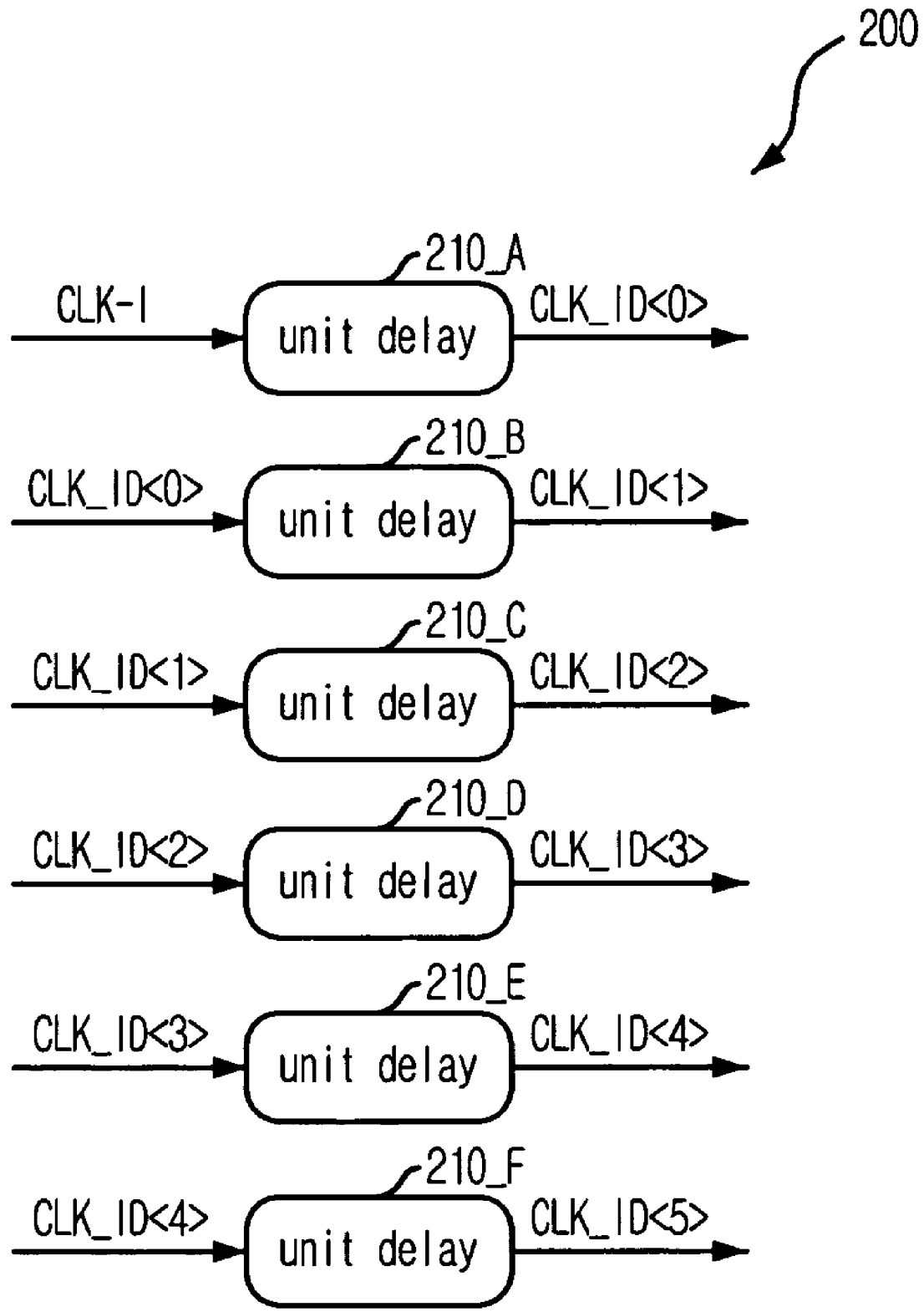
FIG. 2 is a block diagram describing a unit delay set shown in FIG. 1.

FIG. 2 is a block diagram describing the unit delay set 200 shown in FIG. 1.

As shown, the unit delay set 200 is provided with six unit delays 210_A to 210_F serially connected one another. The first delay unit 210_A to which the internal clock CLK2N is inputted delays the internal clock CLK2N for a predetermined unit delay time to thereby output a first delay clock CLKD<0>. The second unit delay 210_B delays the first delay clock CLKD<0> for the unit delay time to thereby output a second delay clock CLKD<1>. The third unit delay 210_C delays the second delay clock CLKD<1> for the unit delay time to output a third delay clock CLKD<2>. The fourth unit delay 210_D delays the third delay clock CLKD<2> for the unit delay time to output a fourth delay clock CLKD<3>. The fifth unit delay 210_E delays the fourth delay clock CLKD<3> for the unit delay time to output a fifth delay clock CLKD<4>. Finally, the sixth unit delay 210_F delays the fifth delay clock CLKD<4> for the unit delay time to output a sixth delay clock CLK<5>.

Figure 3:
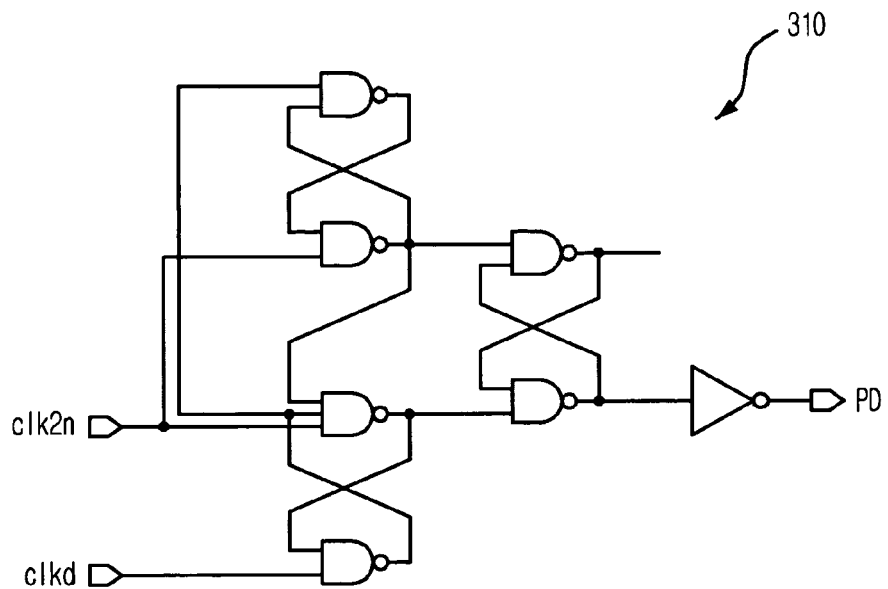
FIG. 3 is a schematic circuit diagram depicting a phase detector in the phase detection block shown in FIG. 1.

FIG. 3 is a schematic circuit diagram depicting a phase detector 310 in the phase detection block 300 shown in FIG. 1.

A plurality of the phase detector 310 are included in the phase detector 300 and are parallel connected one another. Each of the phase detectors 310 detects a phase of the corresponding delay clock CLKD<0:5> at the rising edge of the internal clock CLK2N.

Figure 4:
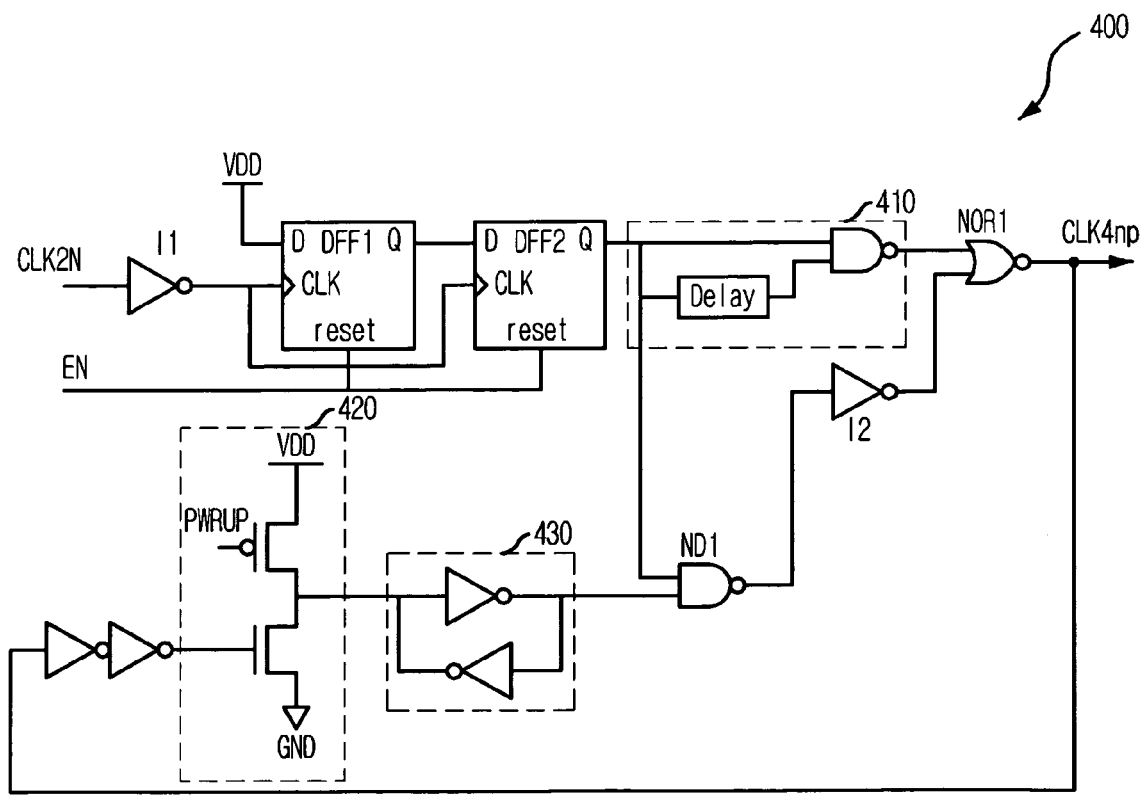
FIG. 4 is a schematic circuit diagram depicting a sampling pulse generator shown in FIG. 1.

FIG. 4 is a schematic circuit diagram depicting the sampling pulse generator 400 shown in FIG. 1.

As shown, the sampling pulse generator 400 includes a pulse generator 410, a first inverting block 420, a first latch 430, first and second D flip-flops, first and second inverters I1 and I2, a first NAND gate ND1, and a first NOR gate NOR1.

The internal clock CLK2N inputted to the sampling pulse generator 400 is inverted by the first inverter I1 and, then, is used as a clock for the first and second D flip-flops DFF1 and DFF2. The first and second D flip-flops are serially connected each other and forms a shift register which is used for generating the sampling signal CLK4NP of 4ns clock pulse at the second falling edge of the internal clock CLK2N. Herein, the first inverting block 420 to which the sampling signal CLK4NP and a power-up signal PWRUP are inputted, the first latch 430 for latching an output from the first inverting block 420, the first NAND gate ND1 to which an output from the second D flip-flop DFF2 and an output from the first latch 430 are inputted, the second input for inverting an output from the first NAND gate are included in the sampling pulse generator 400 in order to control the sampling signal CLK4NP not to be a continuously outputted clock signal but to be a signal with only one pulse.

Meanwhile, the number of D flip-flops of the sampling pulse generator 400 determines an available range of the operation frequency of the semiconductor memory device. In other words, the sampling signal CLK4NP is generated in the second falling edge of the internal clock CLK2N because the first inverter for inverting the internal clock CLK2N and two D flip-flops DFF1 and DFF2 are used in the sampling pulse generator 400 shown in FIG. 4.

Figure 5:
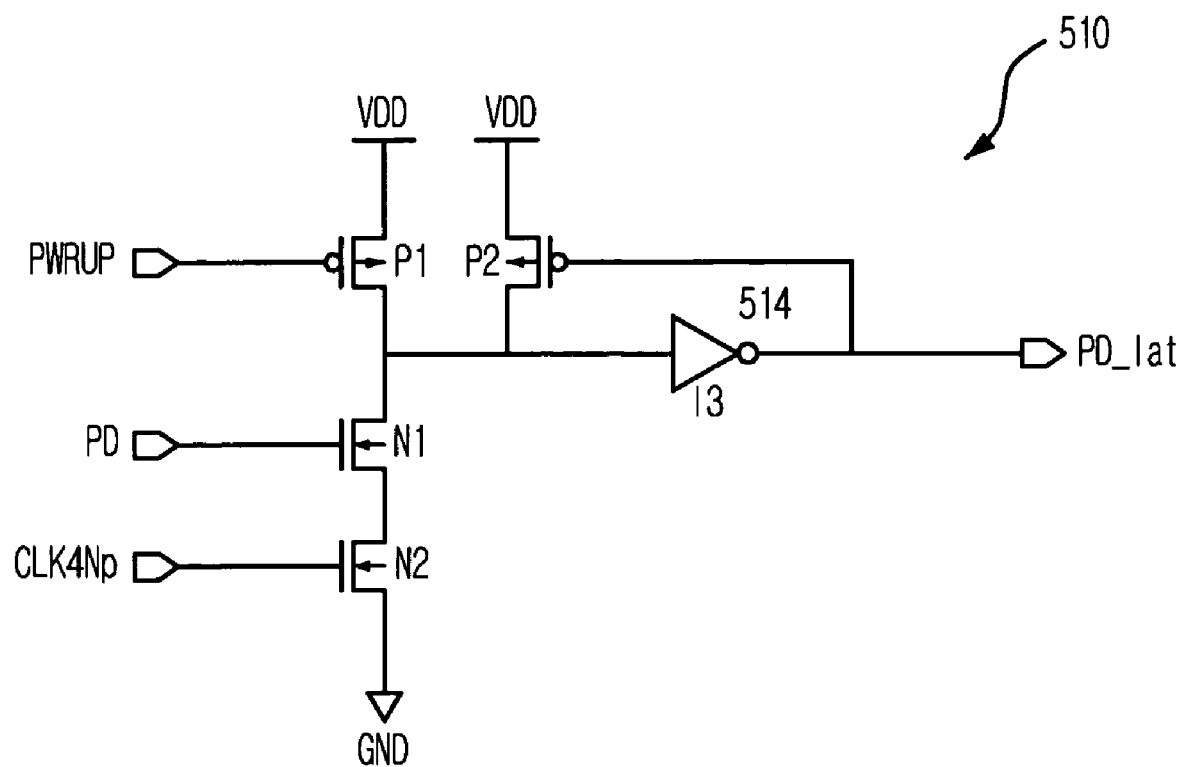
FIG. 5 is a schematic circuit diagram depicting a latch of a latching block shown in FIG. 1.

FIG. 5 is a schematic circuit diagram depicting a latch 510 of the latching block 500 shown in FIG. 1.

As shown, the latch 510 includes first and second PMOS transistor P1 and P2, a plurality of NMOS transistors N1 and N2, and a third inverter I3.

The first PMOS transistor is connected to a power supply voltage VDD and is controlled by the power-up signal PWRUP inputted through a gate. The NMOS transistors N1 and N2 are serially connected to each other between a drain of the first PMOS transistor P1 and a ground voltage GND and are controlled by the phase detection signal PD and the sampling signal CLK4NP. The third inverter I3 is connected to the drain of the first PMOS transistor P1. The second PMOS transistor P2 is connected between the power supply voltage VDD and the drain of the first PMOS transistor P1.

The latch 510 shown in FIG. 5 is provided for the every phase detection signal PD<0:5>. Accordingly, a plurality of the latches 510 are parallel connected one another and latches a logic level of the phase detection signal PD<0:5> to thereby output the phase detection latch signal PD_LAT<0:5> at the time when the sampling signal CLK4NP is inputted to the latching block 500.

Figure 6:
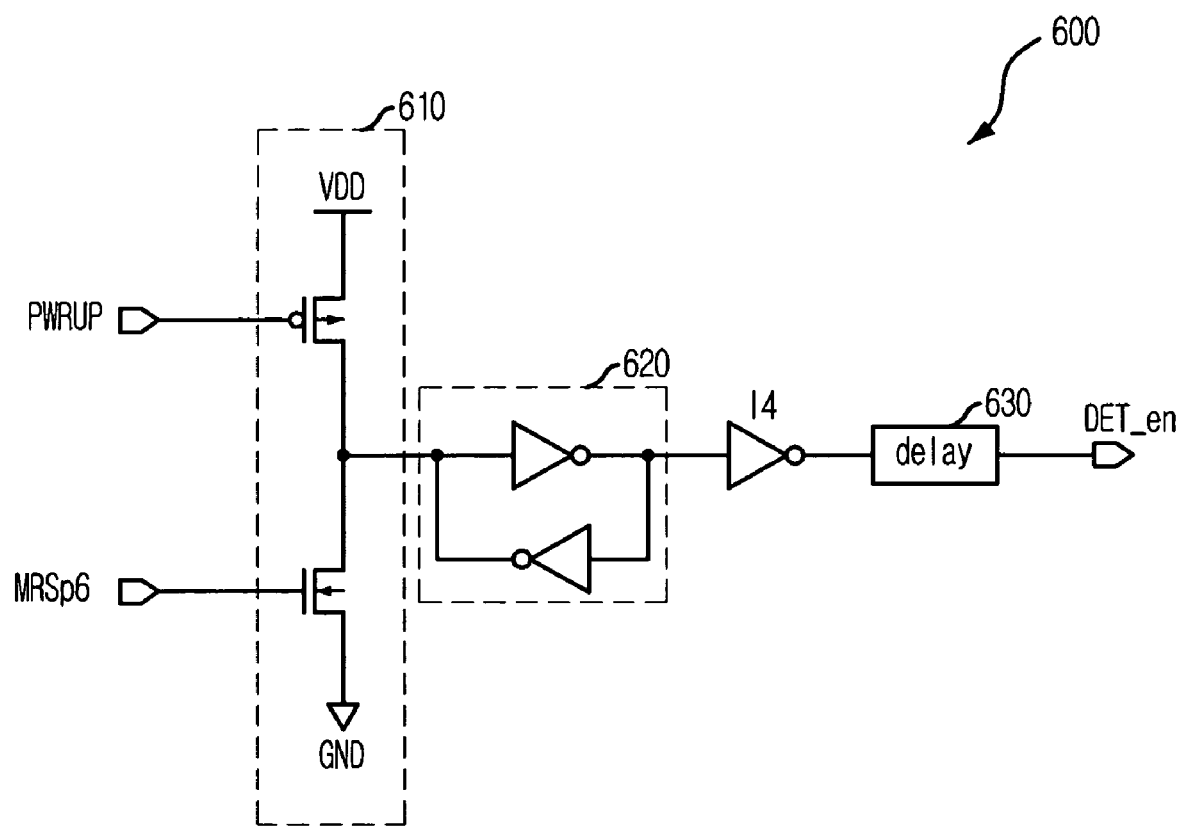
FIG. 6 is a schematic circuit diagram depicting a filter enabling block shown in FIG. 1.

FIG. 6 is a schematic circuit diagram depicting the filter enabling block 600 shown in FIG. 1.

As shown, the filter enabling block 600 is provided with a second inverting block 610 controlled by an external mode register set signal MRSP6, a second latch 620 for latching an output from the second inverting block 610, a fourth inverter I4 for inverting an output from the second latch 620, and a delaying block 630 for delaying an output from the fourth inverter I4. Herein, the external mode register set signal MRSP6 is outputted from outside of the semiconductor memory device.

The second inverting block 610 is controlled by the active low power-up signal PWRUP and the active high external mode register set signal MRSP6. Accordingly, if a level of the power-up signal PWRUP is 'L', the second inverting block 610 outputs the power supply VDD; if a level of the external mode register set signal MRSP6 is 'H', the second inverting block 610 outputs the ground voltage GND. In an early stage of operation, the second inverting block 610 is controlled by the power-up signal PWRUP and outputs the power supply voltage. Then, after the mode register set signal MRSP6 is activated, the second inverting block 610 outputs the ground voltage.

The second latch 620 inverts the ground voltage GND outputted from the second inverting block 610. Therefore, the output from the second latch 610 has a logic level 'H'. The fourth inverter I4 inverts the output from the second latch 620 into a logic level 'L'. The delay block 630 delays the output from the output from the fourth inverter I4 of logic level 'L' to thereby output a detection enable signal DET_EN. The detection enable signal DET_EN is directly inputted to the sequence detection block 700 or is logically combined with an output of the sequence detection block 700.

Figure 7:
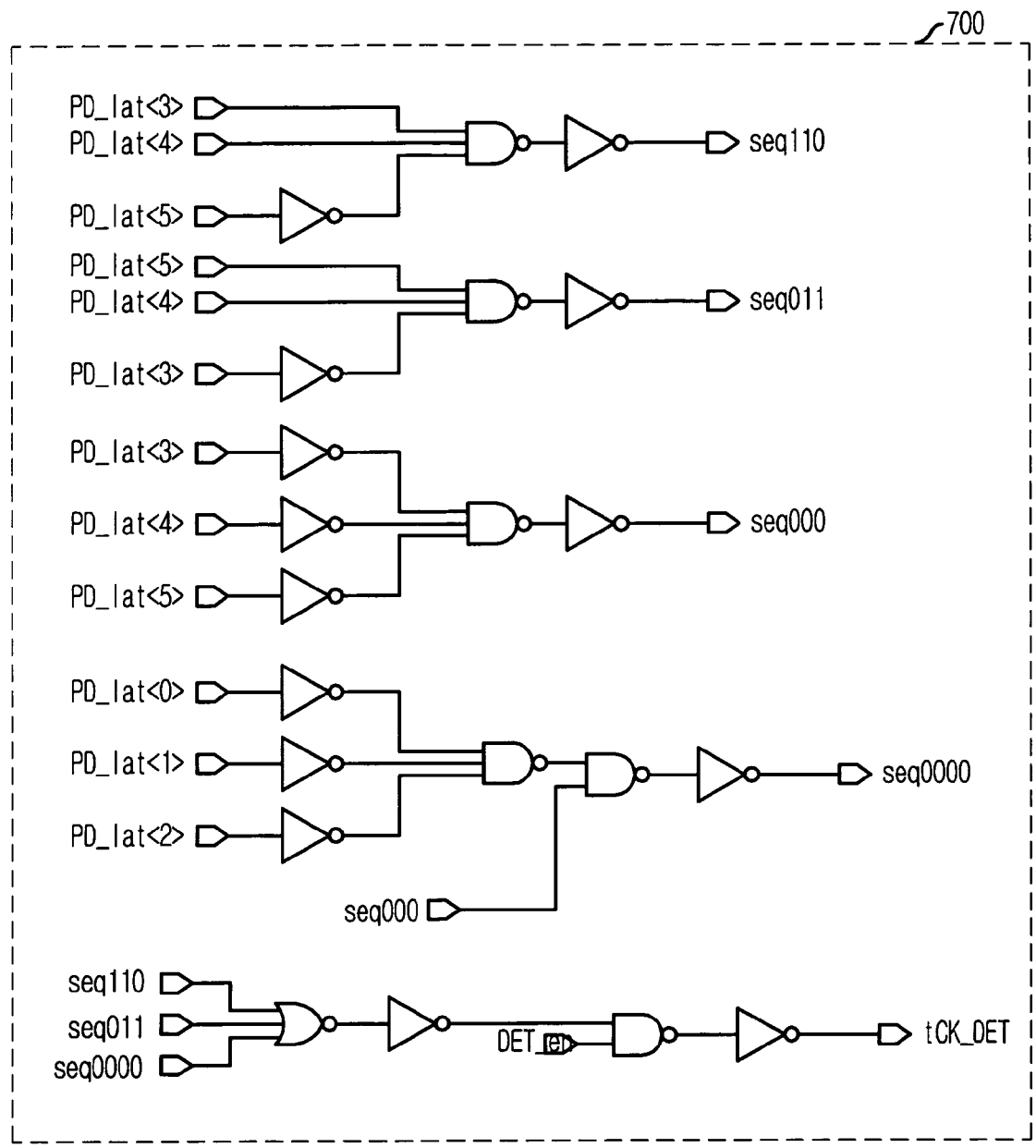
FIG. 7 is a schematic circuit diagram depicting a sequence detection block shown in FIG. 1.

FIG. 7 is a schematic circuit diagram depicting the sequence detection block 700 shown in FIG. 1.

The sequence detection block 700 outputs a frequency detection signal TCK_DET by detecting a sequence of the phase detection latch signal PD_LAT<0:5> and logically combining the phase detection latch signal PD_LAT<0:5>. That is, by detecting the sequence of the phase detection latch signal PD_LAT<0:5>, the sequence detection block 700 detects a operation frequency of the external clock CLK. If the operation frequency is higher than a predetermined frequency, e.g., 4 ns, the frequency detection signal TCK_

DET is inactivated; if the operation frequency is lower than the predetermined frequency, the frequency detection signal TCK_DET is activated.

Figure 8:
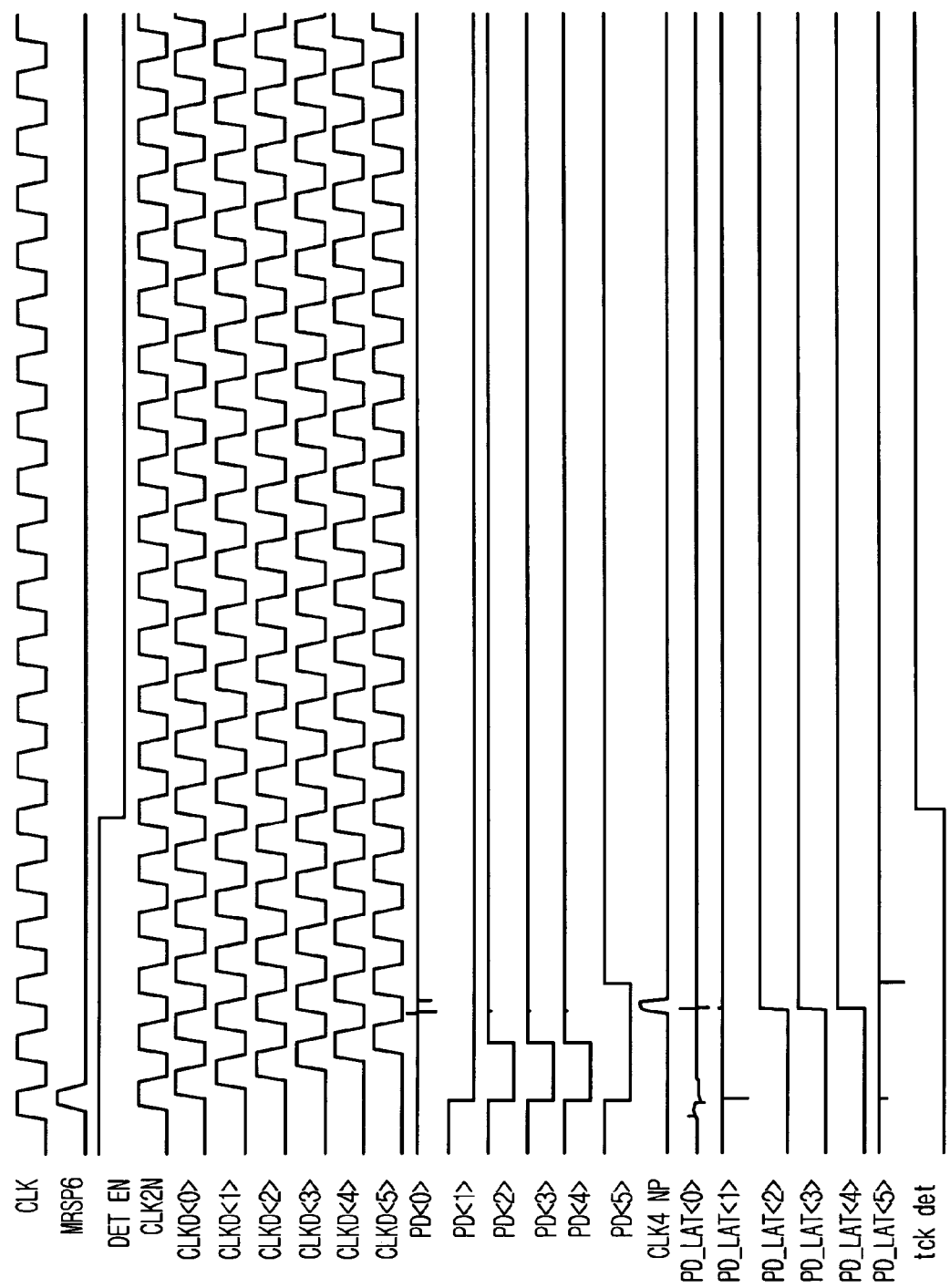
FIGS. 8 to 9 are timing diagrams showing an operation of the present invention when the operation frequency is 4 ns.
Figure 9:
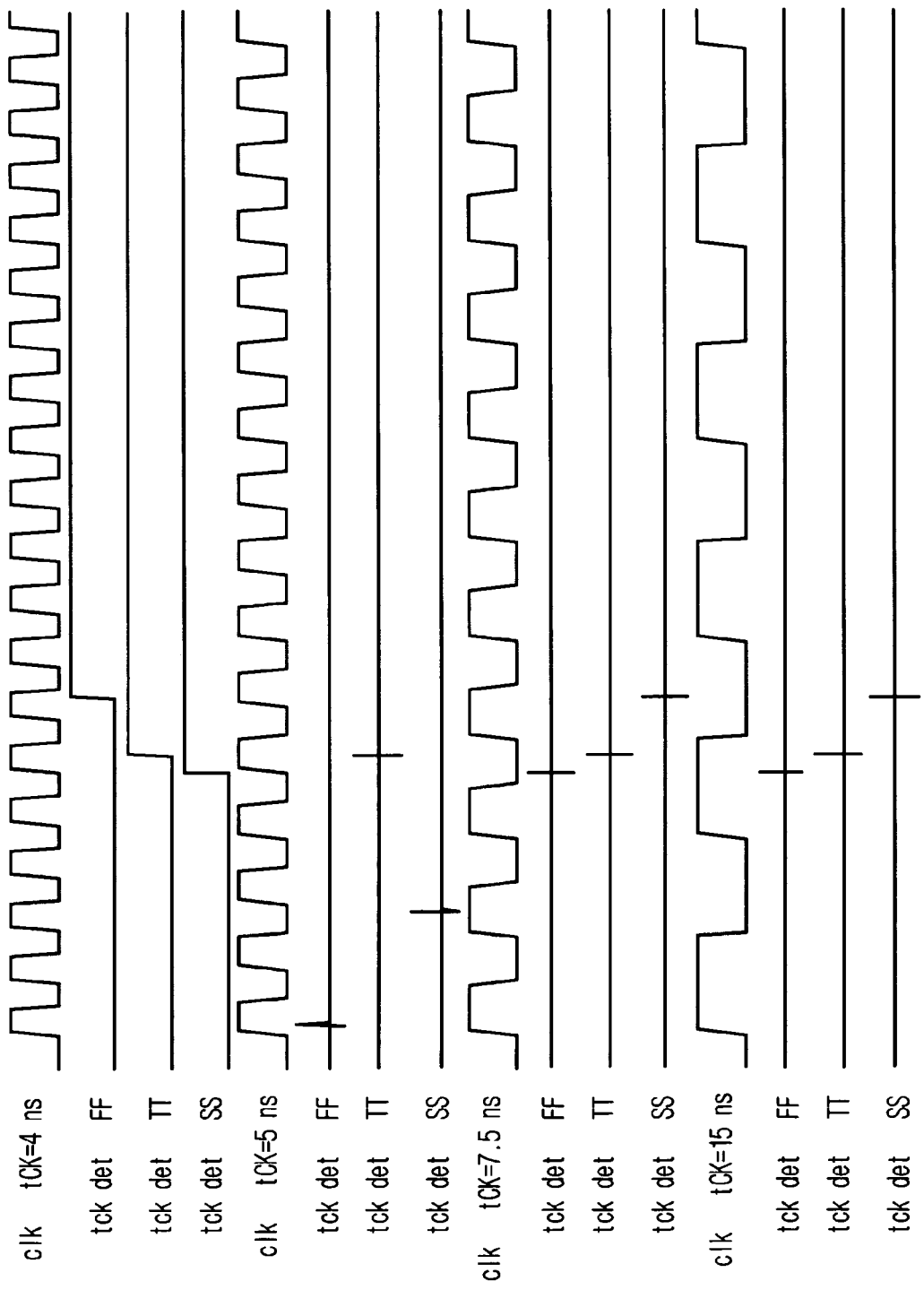

FIGS. 8 to 9 are timing diagrams showing an operation of the present invention when the operation frequency is 4 ns.

Referring to FIG. 9, when the operation frequency is 4 ns, the frequency detection signal TCK_DET is activated into logic level 'H'. Further, when the operation frequency is higher than 4 ns, e.g., 5 ns, 7.5 ns, and 15 ns, the logical level of the frequency detection signal TCK_DET is 'L'. Herein, a waveform of the frequency detection signal TCK_DET is classified into FF type, TT type, SS type. The FF type denotes that a clock skew of the pulse signal is "fast". The SS type denotes that the clock skew is "slow", and the TT type denotes that the clock skew is "typical".

FIG. 10 is a timing diagram showing an operation of the present invention under a condition that the operation frequency is deviated by 5%.

FIG. 10 shows that the present invention works properly through a 5% deviation is occurred to a low pulse width and a high pulse width of the operation frequency.

The present invention prevents the semiconductor memory device from operating under a condition that an operation frequency of an external clock is higher than a predetermined frequency.

The present application contains subject matter related to Korean patent application No. 2005-16758, filed in the Korean Patent Office on Feb. 28, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An operation clock controller for use in a semiconductor memory device, comprising:
    a buffering means for buffering an external clock to thereby output an internal clock;
    a frequency detecting means for outputting a frequency detection signal having a first logic level when a frequency of the internal clock is lower than a predetermined frequency and having a second logic level when the frequency of the internal clock is higher than the predetermined frequency,
    wherein the frequency detecting means includes a unit delaying set for sequentially delaying the internal clock to output a plurality of delayed clocks,
    wherein the frequency of the internal clock is detected based on the delayed clocks and the predetermined frequency is lower than a maximum operation frequency of the semiconductor memory device.

2. The operation clock controller as recited in claim 1, wherein the frequency detecting means includes:
    a phase detecting means for detecting logic levels of the delayed clocks at a rising edge of the internal clock to thereby output corresponding phase detecting signals;
    a sampling pulse generating means for outputting a sampling signal generated at a predetermined point of the internal clock;
    a latching means for outputting a phase detection latch signal by sampling and latching the phase detection signal at a point of the sampling signal being inputted; and
    a sequence detecting means for outputting the frequency detection signal by logically combining the phase detection latch signal.

3. The operation clock controller as recited in claim 2, further comprising an enable signal generating means for generating an enable signal in response to an external command, wherein the enable signal and the phase detection latch signal are logically combined and are used to generate the frequency detection signal.

4. The operation clock controller as recited in claim 2, further comprising an enable signal generating means for generating an enable signal in response to an external command, wherein the enable signal is logically combined with the frequency detection signal.

5. The operation clock controller as recited in claim 3, wherein the unit delay set includes a plurality of unit delays.

6. The operation clock controller as recited in claim 5, wherein the sampling pulse generator includes:
    a first inverter for inverting the internal clock to output an inverted internal clock;
    first and second D flip-flops serially connected to each other for receiving the inverted internal clock as a clock, respectively;
    a second inverter for receiving the sampling signal and an external power-up signal;
    a latch for latching an output from the second inverter;
    a NAND gate for receiving an output from the second D flip-flop and an output from the latch;
    a third inverter for inverting an output from the NAND gate;
    a pulse generator for generate a pulse by using the output from the second D flip-flop; and
    a NOR gate for outputting the sampling signal by receiving an output from the pulse generator and the output from an output from the third inverter.

7. The operation clock controller as recited in claim 6, wherein the latching means includes:
    a first PMOS transistor controlled by the external power-up signal and connected to a power supply voltage;
    first and second NMOS transistors serial-connected between a drain of the first PMOS transistor and a ground voltage and controlled by the phase detection signal and the sampling signal, respectively;
    an inverter connected to the drain of the first PMOS transistor; and
    a second PMOS transistor connected between the power supply voltage and the drain of the first PMOS transistor and controlled by an output from the inverter.

8. The operation clock controller as recited in claim 7, wherein the enable signal generating means includes:
    a first inverter controlled by the external command;
    a latch for latching an output from the first inverter; a second inverter for inverting an output from the latch; and
    a delay for delaying an output from the second inverter.

9. The operation clock controller as recited in claim 4, wherein the unit delay set includes a plurality of unit delays.

10. The operation clock controller as recited in claim 9, wherein the sampling pulse generator includes:
    a first inverter for inverting the internal clock to output an inverted internal clock;
    first and second D flip-flops serially connected to each other for receiving the inverted internal clock as a clock, respectively;
    a second inverter for receiving the sampling signal and an external power-up signal;
    a latch for latching an output from the second inverter;
    a NAND gate for receiving an output from the second D flip-flop and an output from the latch;

a third inverter for inverting an output from the NAND gate;

a pulse generator for generating a pulse by using the output from the second D flip-flop; and a NOR gate for outputting the sampling signal by receiving an output of the pulse generator and an output of the third inverter.

11. The operation clock controller as recited in claim 10, wherein the latching means includes:

a first PMOS transistor controlled by the external power-up signal and connected to a power supply voltage;

first and second NMOS transistors serially connected between a drain of the first PMOS transistor and a ground voltage and controlled by the phase detection signal and the sampling signal, respectively;

an inverter connected to the drain of the first PMOS transistor; and a second PMOS transistor connected between the power supply voltage and the drain of the first PMOS transistor and controlled by an output of the inverter.

12. The operation clock controller as recited in claim 11, wherein the enable signal generating means includes:

a first inverter controlled by the external command;

a latch for latching an output from the first inverter;

a second inverter for inverting an output from the latch; and a delay for delaying an output from the second inverter.

13. An operation clock controlling method for a semiconductor memory device comprising the steps of:

(a) outputting an internal clock by buffering an external clock; and (b) outputting a frequency detection signal having a first logic level when a frequency of the internal clock is lower than a predetermined frequency and having a second logic level when the frequency of the internal clock is higher than the predetermined frequency, wherein the step (b) includes (b1) outputting a plurality of delayed clocks by sequentially delaying the internal clock, wherein the frequency of the internal clock is detected based on the delayed clocks and the predetermined frequency is lower than a maximum operation frequency of the semiconductor memory device.

14. The operation clock controlling method as recited in claim 13, wherein the step (b) includes:

(b2) detecting logic levels of the delayed clocks at a rising edge of the internal clock to thereby output corresponding phase detecting signals;

(b3) outputting a sampling signal generated at a predetermined point of the internal clock;

(b4) outputting a phase detection latch signal by sampling and latching the phase detection signal at a point of the sampling signal being inputted;

(b5) outputting an enable signal in response to an external command; and (b6) outputting the frequency detection signal by logically combining the phase detection latch signal.

15. The operation clock controlling method as recited in claim 13, wherein the step (b) includes:

(b2) detecting logic levels of the delayed clocks at a rising edge of the internal clock to output corresponding phase detecting signals;

(b3) outputting a sampling signal generated at a predetermined point of the internal clock;

(b4) outputting a phase detection latch signal by sampling and latching the phase detection signal at a point of the sampling signal being inputted;

(b5) outputting the frequency detection signal by logically combining the phase detection latch signal;

(b6) outputting an enable signal in response to an external command; and (b7) logically combining the frequency detection signal and the enable signal to control an operation of an operation clock controller.

* * * * *